US012751066B2

(12) United States Patent
Liu et al.

(10) Patent No.: US 12,751,066 B2
(45) Date of Patent: Sep. 29, 2026

(54) NITRIDE SEMICONDUCTOR DEVICE

(71) Applicant: XIAMEN SAN'AN INTEGRATED CIRCUIT CO., LTD., Xiamen (CN)

(72) Inventors: Shenghou Liu, Xiamen (CN); Yihang Liang, Xiamen (CN); Guanying Huang, Xiamen (CN); Zichen Wang, Xiamen (CN); Xiguo Sun, Xiamen (CN)

(73) Assignee: XIAMEN SAN'AN INTEGRATED CIRCUIT CO., LTD., Xiamen (CN)

( * ) Notice: Subject to any disclaimer, the term of this patent is extended or adjusted under 35 U.S.C. 154(b) by 295 days.

(21) Appl. No.: 18/603,382

(22) Filed: Mar. 13, 2024

(65) Prior Publication Data

US 2024/0274672 A1 Aug. 15, 2024

Related U.S. Application Data

(63) Continuation of application No. PCT/CN2023/130872, filed on Nov. 10, 2023.

(30) Foreign Application Priority Data

Dec. 21, 2022 (CN) ........................ 202211647531.0

(51) Int. Cl.

| | |
|---|---|
| ***H10D 64/00*** | (2025.01) |
| ***H10D 30/01*** | (2025.01) |
| ***H10D 30/47*** | (2025.01) |
| ***H10D 62/85*** | (2025.01) |
| ***H10D 64/01*** | (2025.01) |

(52) U.S. Cl.

CPC ......... *H10D 64/111* (2025.01); *H10D 30/015* (2025.01); *H10D 30/475* (2025.01); *H10D 62/8503* (2025.01); *H10D 64/01* (2025.01)

(58) Field of Classification Search

CPC .. H10D 64/111; H10D 30/015; H10D 30/475; H10D 62/8503; H10D 64/01; H10D 64/112; H10D 64/513; H10D 62/124; H10D 62/824; H10D 30/021; Y02B 70/10

See application file for complete search history.

(56) References Cited

U.S. PATENT DOCUMENTS

2019/0140086 A1* 5/2019 Chikamatsu ......... H10D 30/475

FOREIGN PATENT DOCUMENTS

| | | | |
|---|---|---|---|
| CN | 101414622 | A | 4/2009 |
| CN | 103367403 | A | 10/2013 |
| CN | 115050819 | A | 9/2022 |

* cited by examiner

*Primary Examiner* — Karen Kusumakar
(74) *Attorney, Agent, or Firm* — Hemisphere Law, PLLC

(57) ABSTRACT

A nitride semiconductor device is provided. It includes a source electrode, a drain electrode, a gate electrode, a dielectric material layer and a stepped source field plate. The gate electrode is located between the source electrode and the drain electrode. The stepped source field plate is arranged in a part of the dielectric material layer and includes a first stepped portion and a second stepped portion respectively separated from a nitride epitaxial layer by different dielectric material layer thicknesses, and a part of the dielectric material layer between the stepped source field plate and the drain electrode is defined with a groove. By combining the stepped source field plate with the groove, parasitic capacitances Cgd and Cds are effectively reduced, the radio frequency (RF) gain of the device is improved, and the application bandwidth of the device is broadened.

20 Claims, 4 Drawing Sheets

NITRIDE SEMICONDUCTOR DEVICE

TECHNICAL FIELD

The disclosure relates to the field of semiconductor technologies, and more particularly to a nitride semiconductor device.

BACKGROUND

Monolithic microwave integrated circuit (MMIC) is a kind of functional circuit used in a microwave frequency band (even used in a millimeter wave frequency band). It has a series of advantages such as low circuit loss, wide frequency band, large dynamic range and low noise, which is very important for the development of military electronic equipment and civil electronic products. Compared with silicon (Si) or gallium arsenide (GaAs), gallium nitride (GaN) has better performance, such as higher breakdown voltage, higher saturated electron drift velocity and higher thermal conductivity, and high-gain and large broadband GaN MMIC has a very strong demand in the special application market.

The performance of GaN devices is the core factor to determine the characteristics of MMIC. Compared with narrow bandgap radio frequency power amplifiers (RF PA) made of GaN, wide bandgap RF PA made of GaN provide improvements in bandwidth, output power and efficiency, but their RF gain and application bandwidth are still limited due to parasitic capacitance and other problems.

SUMMARY

The disclosure provides a high-gain broadband nitride semiconductor device and a manufacturing method thereof aiming at the shortcomings in the related art.

In order to achieve the above objectives, the technical solutions of the disclosure are as follows.

Specifically, in an aspect, a nitride semiconductor device includes a nitride epitaxial layer, a source electrode, a drain electrode, a gate electrode, a dielectric material layer and a stepped source field plate. The nitride epitaxial layer includes a heterojunction formed by a channel layer and a barrier layer, and the source electrode, the drain electrode and the gate electrode are located on the nitride epitaxial layer. The gate electrode is located between the source electrode and the drain electrode, and the dielectric material layer covers the nitride epitaxial layer and the gate electrode. The stepped source field plate is arranged in a part of the dielectric material layer located between the gate electrode and the drain electrode. The stepped source field plate includes a first stepped portion with a dielectric material layer thickness h1 separated from the nitride epitaxial layer and a second stepped portion with a dielectric material layer thickness h2 separated from the nitride epitaxial layer, where h1<h2. A part of the dielectric material layer located between the stepped source field plate and the drain electrode is defined with a groove.

In an embodiment, the first stepped portion is close to the gate electrode, and the second stepped portion extends from the first stepped portion toward the drain electrode.

In an embodiment, the stepped source field plate further includes a third stepped portion extending from the first stepped portion toward the gate electrode, and the third stepped portion extends above the gate electrode and is separated from the gate electrode by a part of the dielectric material layer.

In an embodiment, a material of the dielectric material layer includes one or more selected from the group consisting of silicon nitride ($SiN_x$), silicon oxide ($SiO_x$), silicon oxynitride ($Si_xON_y$), aluminum oxide ($AlO_x$), aluminum nitride (AlN), aluminum oxynitride ($Al_xON_y$) and hafnium oxide ($HfO_x$).

In an embodiment, the dielectric material layer includes a first dielectric layer and a second dielectric layer. The first dielectric layer is arranged on a surface of the nitride epitaxial layer and is defined with a first opening to accommodate the gate electrode. The second dielectric layer covers the gate electrode and the first dielectric layer and is defined with a second opening. The first stepped portion is disposed in the second opening; and the second stepped portion is disposed on a surface of the second dielectric layer.

In an embodiment, the gate electrode is a T-shaped gate structure, and the first opening of the first dielectric layer is used to define a bottom (i.e., gate root) of the T-shaped gate structure.

In an embodiment, h1 is a thickness of the first dielectric layer, and h2 is a sum of the thickness of the first dielectric layer and a thickness of the second dielectric layer.

In another embodiment, the second dielectric layer is a multi-layer dielectric laminated structure, and the second opening is defined to a certain layer in the laminated structure, where h1 is greater than the thickness of the first dielectric layer, and h2 is the sum of the thickness of the first dielectric layer and the thickness of the second dielectric layer.

In an embodiment, the dielectric material layer further includes a third dielectric layer covering the second dielectric layer and the stepped source field plate. A part of the first dielectric layer is reserved between a bottom of the groove and the nitride epitaxial layer.

In an embodiment, the nitride semiconductor device further includes a low dielectric constant surface layer, the low dielectric constant surface layer fills the groove, and a dielectric constant of the low dielectric constant surface layer is less than 3.

In an embodiment, a spacing between the first stepped portion and the gate electrode is greater than 0.1 micrometers (μm). A spacing between a side wall of the groove close to the stepped source field plate and the stepped source field plate and a spacing between another side wall of the groove close to the drain electrode and the drain electrode are greater than 0.1 μm.

In an embodiment, a material of the barrier layer includes any one selected from the group consisting of gallium aluminum nitride (AlGaN), AlN, indium aluminum gallium nitride (InAlGaN), and indium aluminum nitride (InAlN).

In another aspect, a method for manufacturing a semiconductor device includes:

- step (1), forming a source electrode, a drain electrode and a first dielectric layer on a nitride epitaxial layer, etching the first dielectric layer to define a first opening between the source electrode and the drain electrode, and manufacturing a gate electrode in the first opening;
- step (2), depositing a second dielectric layer to cover the gate electrode and the first dielectric layer;
- step (3), etching the second dielectric layer to define a second opening between the gate electrode and the drain electrode;
- step (4), defining a deposition area of a stepped source field plate by photolithography process, depositing a metal to form the stepped source field plate, where the stepped source field plate includes a first stepped portion formed in the second opening and a second stepped portion formed on a surface of the second dielectric layer;

step (5), depositing a third dielectric layer to cover the second dielectric layer and the stepped source field plate; and step (6), defining a groove area between the stepped source field plate and the drain electrode through photolithography process, and etching to remove parts of the third dielectric layer and the second dielectric layer in the groove area to form a groove.

In an embodiment, the method further includes: step (7), depositing a low dielectric constant surface layer with a dielectric constant less than 3, and filling the groove with the low dielectric constant surface layer.

The disclosure has the beneficial effects as follows.

By combining the stepped source field plate with the groove, the first stepped structure of the stepped source field plate is close to the channel, which can effectively modulate the electric field and suppress the gate-drain capacitance Cgd. Lengthening the distance between the second stepped structure and the channel can reduce the source-drain capacitance Cds between the field plate and the drain electrode, and simultaneously adjust the electric field distribution in the channel to reduce the peak intensity of the electric field. The groove is located between the stepped source field plate and the drain electrode and has a low dielectric constant, further reducing the source-drain capacitance Cds. The combination of the two effectively reduces the parasitic capacitance Cgd and Cds, improves the radio frequency (RF) gain of the device, and broadens the bandwidth of the device application.

DETAILED DESCRIPTION OF EMBODIMENTS

The disclosure will be further described with the attached drawings and specific embodiments. The drawings of the disclosure are only schematic drawings to make it easier to understand the disclosure, and specific scales can be adjusted according to the design requirements. It should be understood by those skilled in the art that upper and lower relationships of relative elements and the definition of front/back in the figure described herein refer to the relative positions of components, and thus the same components can be presented by turning over, which should fall within the scope disclosed in this specification.

Embodiment 1

Figure 1A:
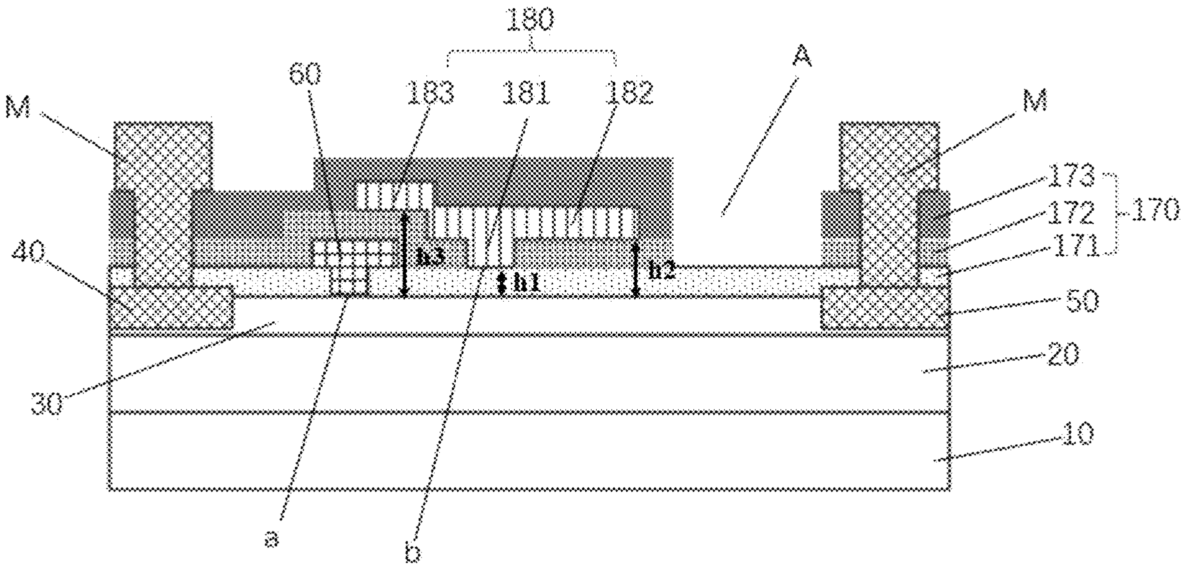
FIG. 1A illustrates a schematic cross-sectional view of a nitride semiconductor device according to an embodiment 1 of the disclosure.
Figure 1B:
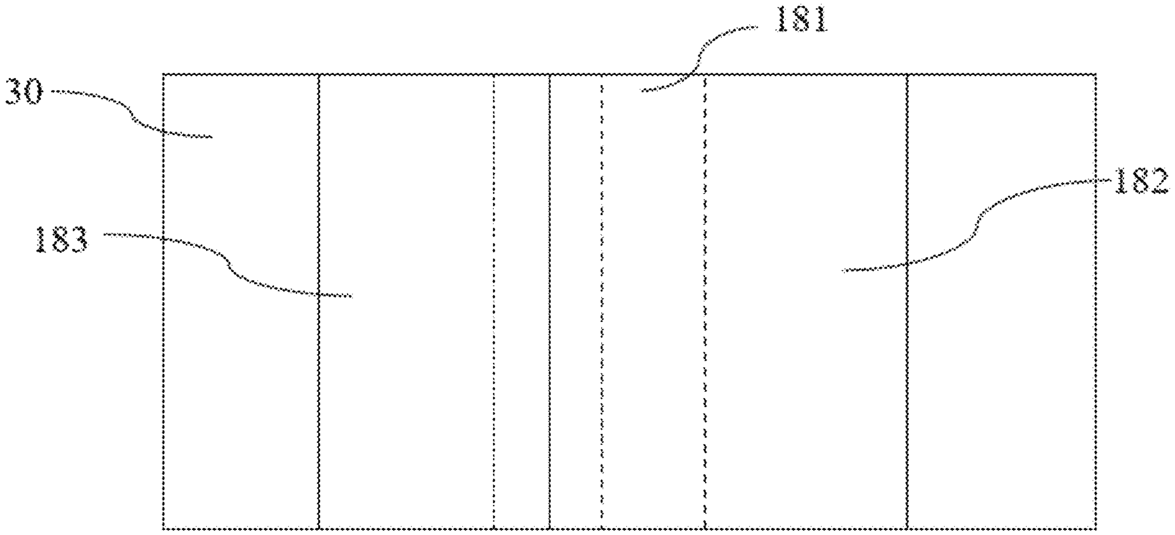
FIG. 1B illustrates a schematic diagram of projections of a first stepped portion, a second stepped portion, and a third stepped portion of the nitride semiconductor device on a nitride epitaxial layer according to the embodiment 1 of the disclosure.

As shown in FIGS. 1A-1B, a nitride semiconductor device of an embodiment includes a substrate 10, a gallium nitride (GaN) layer 20, an aluminum gallium nitride (AlGaN) layer 30, a source electrode 40, a drain electrode 50, a gate electrode 60, a dielectric material layer 170 and a stepped source field plate 180. As a conventional arrangement, the GaN layer 20 and the AlGaN layer 30 are arranged above the substrate 10 sequentially in that order to form a heterojunction. The source electrode 40 and the drain electrode 50 are arranged in a part of the AlGaN layer 30 along the depth direction, and the gate electrode 60 is arranged above a part of the AlGaN layer 30 located between the source electrode 40 and the drain electrode 50. The dielectric material layer 170 covers the surface of the above-mentioned structure, and the source electrode 40 and the drain electrode 50 are respectively connected to interconnection metals M penetrating through the dielectric material layer 170 for extraction. The stepped source field plate 180 is located between the gate electrode 60 and the drain electrode 50. The stepped source field plate 180 is arranged in the dielectric material layer 170, the stepped source field plate 180 is isolated from the AlGaN layer 30, the gate electrode 60 and the drain electrode 50 by the dielectric material layer 170, and is connected to the source electrode 40 outside an active area of the device. A part of the dielectric material layer 170 located between the stepped source field plate 180 and the drain electrode 50 is defined with a groove A formed by removing a part of the thickness of the dielectric material layer 170, and the groove A defines a source-drain cavity.

Of course, in the embodiment of the disclosure, a channel layer and a barrier layer constituting the heterojunction structure can also be respectively made of a GaN material and an InGaN (indium gallium nitride) material, etc., and there is no restriction on the specific materials of the channel layer and the barrier layer as long as the heterojunction structure can be formed. The barrier layer may be made of AlGaN, AlN (aluminum nitride), AlInN (aluminum indium nitride), AlGaN, InGaN, AlInGaN (aluminum indium gallium nitride) or the like.

In this embodiment, the dielectric material layer 170 includes a first dielectric layer 171, a second dielectric layer 172 and a third dielectric layer 173 from bottom to top. The first dielectric layer 171 is disposed on a surface of the AlGaN layer 30 and is defined with a first opening a to accommodate the gate electrode 60, and the gate electrode 60 is formed in the first opening a and extends to a surface of the first dielectric layer 171 on two sides of the first opening a to form a T-shaped structure. The second dielectric layer 172 covers the gate electrode 60 and the first dielectric layer 171. The second dielectric layer 172 is defined with a second opening b located between the gate electrode 60 and the drain electrode 50 and close to the gate electrode 60, and a bottom of the second opening b exposes the surface of the first dielectric layer 171. The stepped source field plate 180 includes a first stepped portion 181, a second stepped portion 182 and a third step portion 183 which are connected. The first stepped portion 181 is formed in the second opening b. The second stepped portion 182 is formed on a surface of the second dielectric layer 172 and extends from the first stepped portion 181 toward the drain electrode 50. The third stepped portion 183 is formed on the surface of the second dielectric layer 172, and extends from the first stepped portion 181 to above the gate electrode 60, that is, the third stepped portion 183 is separated from the gate electrode 60 by the second dielectric layer 172. In this situation, a spacing between the first stepped portion 181 and the AlGaN layer 30 is a thickness h1 of the first dielectric layer 171, a spacing between the second stepped portion 182 and the AlGaN layer 30 is a sum h2 of the thicknesses of the first dielectric layer 171 and the second dielectric layer 172, and the difference between the thicknesses of the first stepped portion 181 and the second stepped portion 182 is the thickness of the second dielectric layer 172. The third stepped portion is separated from the AlGaN layer 30 by a dielectric material layer thickness h3. The first stepped portion 181 is close to the channel, which can effectively modulate the electric field and suppress the gate-drain capacitance Cgd. The distance between the second stepped portion 182 and the channel is lengthened, which can reduce the source-drain capacitance Cds between the field plate and the drain electrode, and simultaneously adjust the electric field distribution in the channel to reduce the peak intensity of the electric field.

As shown in FIG. 1B, a projection of the second stepped portion 182 on the nitride epitaxial layer (e.g., the AlGaN layer 30) covers a projection of the first stepped portion 181 on the AlGaN layer 30. A distance (i.e., thickness h3 as shown in FIG. 1A) from a side surface of the third stepped portion 183 close to the AlGaN layer 30 to the surface of the AlGaN layer 30 in contact with the dielectric material layer 170 is greater than a distance (i.e., thickness h2 as shown in FIG. 1A) from a side surface of the second stepped portion 182 close to the AlGaN layer 30 to the surface of the AlGaN layer 30 in contact with the dielectric material layer 170, that is, h3>h2. The distance from the side surface of the second stepped portion 182 close to the AlGaN layer 30 to the surface of the AlGaN layer 30 in contact with the dielectric material layer 170 is greater than a distance (i.e., the thickness h1 as shown in FIG. 1A) from a side surface of the first stepped portion 181 close to the AlGaN layer 30 to the surface of the AlGaN layer 30 in contact with the dielectric material layer 170, that is, h2>h1. The projection of the third stepped portion 183 on the AlGaN layer 30 does not coincide with the projection of the first stepped portion 181 on the AlGaN layer 30, and the projection of the third stepped portion 183 on the AlGaN layer 30 partially coincides with the projection of the second stepped portion 182 on the AlGaN layer 30.

The third dielectric layer 173 covers the second dielectric layer 172 and the stepped source field plate 180. The groove A is formed by removing parts of the third dielectric layer 173 and the second dielectric layer 172 between the stepped source field plate 180 and the drain electrode 50, and retaining the first dielectric layer 171, which ensures passivation of the surface of the device while reducing the dielectric constant (1 for air) between the stepped source field plate 180 and the drain electrode, and further reducing the source-drain capacitance Cds.

In this embodiment, the first dielectric layer 171, the second dielectric layer 172 and the third dielectric layer 173 are made of materials such as silicon nitride ($SiN_x$), silicon oxide ($SiO_x$), silicon oxynitride ($Si_xON_y$), aluminum oxide ($AlO_x$), aluminum nitride (AlN), and aluminum oxynitride ($Al_xON_y$), hafnium oxide ($HfO_x$), etc. The thickness of the first dielectric layer 171 is in a range of 20 nanometers (nm) to 200 nm, the thickness of the second dielectric layer 172 is in a range of 50 nm to 500 nm, and the thickness of the third dielectric layer 173 is 50 nm to 1 micrometer (μm). A spacing between the first stepped portion 181 and the gate electrode 60 is greater than 0.1 μm, a spacing between the second stepped portion 182 and the drain electrode 50 is about 2-3 μm, and the nearest distance between the sidewall of the groove A and each of the second stepped portion 182 and the drain electrode 50 is not less than 0.1 μm to ensure that the stepped source field plate 180, the drain electrode 50 and their interconnection metals M are protected by the dielectric material layer. According to the requirements of structural design and manufacturing process design, the first dielectric layer 171, the second dielectric layer 172 and the third dielectric layer 173 can be made of the same or different materials.

By combining the stepped source field plate 180 with the groove A, the parasitic capacitances Cgd and Cds are effectively reduced, the radio frequency (RF) gain of the device is improved, and the application bandwidth of the device is broadened.

As shown in FIGS. 2A-2G, a manufacturing method of the nitride semiconductor device includes the following steps.

Figure 2A:
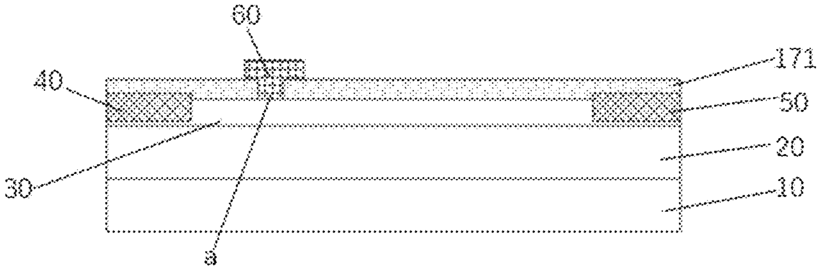
FIGS. 2A-2G illustrate process flowcharts of the nitride semiconductor device according to the embodiment 1 of the disclosure.

Step (1), a source electrode 40 and a drain electrode 50 are formed on an AlGaN/GaN heterojunction epitaxial wafer, then a first dielectric layer 171 is deposited, the first dielectric layer 171 is etched to define a first opening a between the source electrode 40 and the drain electrode 50, and a T-shaped gate electrode 60 is formed on the first opening a, as shown in FIG. 2A.

Figure 2B:
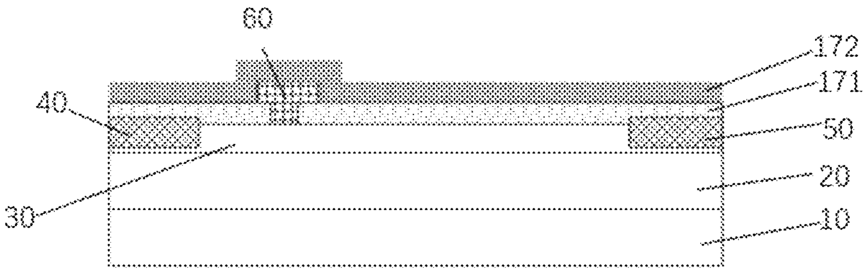

Step (2), a second dielectric layer 172 is deposited to cover the gate electrode 60 and the first dielectric layer 171 by plasma-enhanced chemical vapor deposition (PECVD), low pressure chemical vapor deposition (LPCVD), atomic layer deposition (ALD), physical vapor deposition (PVD), etc., as shown in FIG. 2B.

Figure 2C:
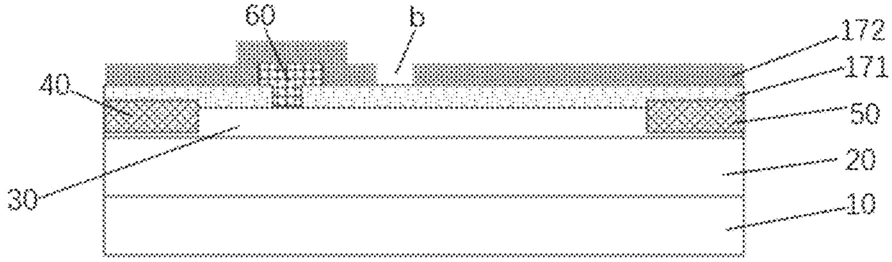

Step (3), the second dielectric layer 172 is etched by dry etching or wet etching to define a second opening b between the gate electrode 60 and the drain electrode 50, and the first dielectric layer 171 is exposed at a bottom of the second opening b, as shown in FIG. 2C.

Figure 2D:
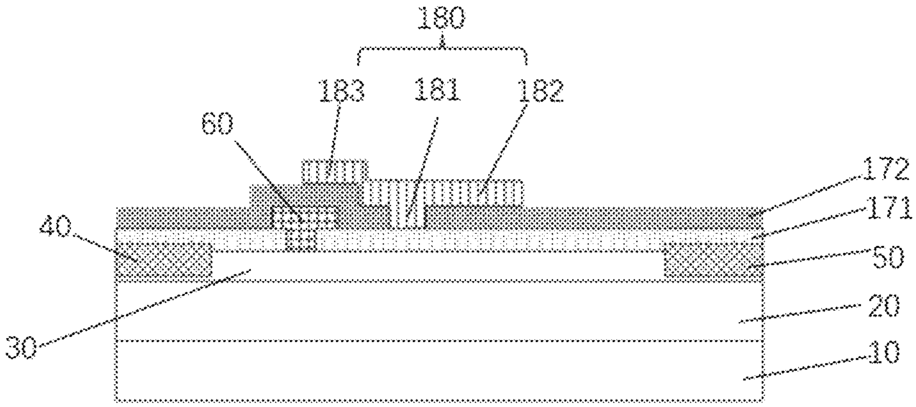

Step (4), a deposition area of a stepped source field plate including the second opening b is defined by photolithography process, a metal is deposited, and peeled off to form the stepped source field plate 180, as shown in FIG. 2D.

Figure 2E:
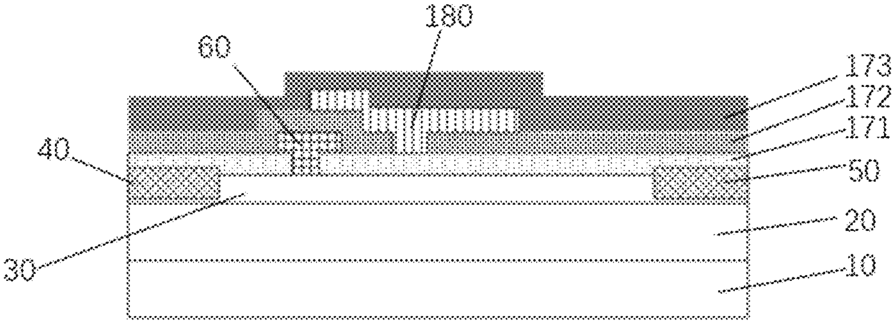

Step (5), a third dielectric layer 173 is deposited by PECVD, LPCVD, ALD, PVD, etc., to cover the second dielectric layer 172 and the stepped source field plate 180, as shown in FIG. 2E.

Figure 2F:
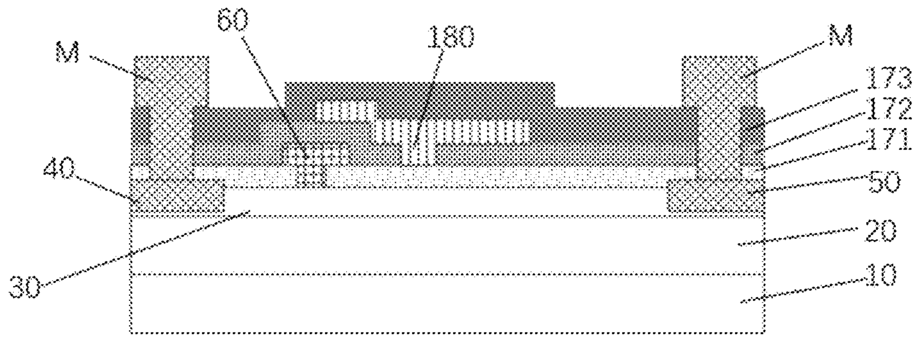

Step (6), a deposition area of interconnection metals M is defined by photolithography process, through holes penetrating through the first to third dielectric layers are etched to expose the surfaces of the source electrode 40 and the drain electrode 50, and the through holes are metallized to form the interconnect metals M, as shown in FIG. 2F.

Figure 2G:
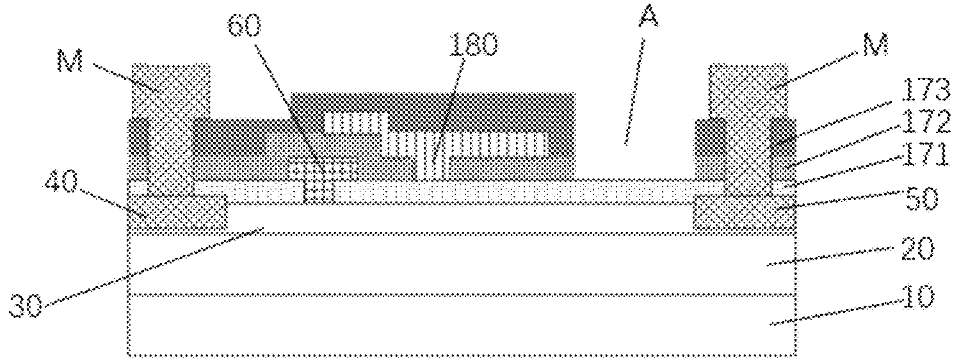

Step (7), a region of a groove A between the stepped source field plate 180 and the drain electrode 50 is defined by photolithography process, parts of the third dielectric layer 173 and the second dielectric layer 172 in the region of the groove A are etched off to form the groove A, and the first dielectric layer 171 is reserved to maintain the passivation effect of the GaN device, as shown in FIG. 2G.

Embodiment 2

Figure 3:
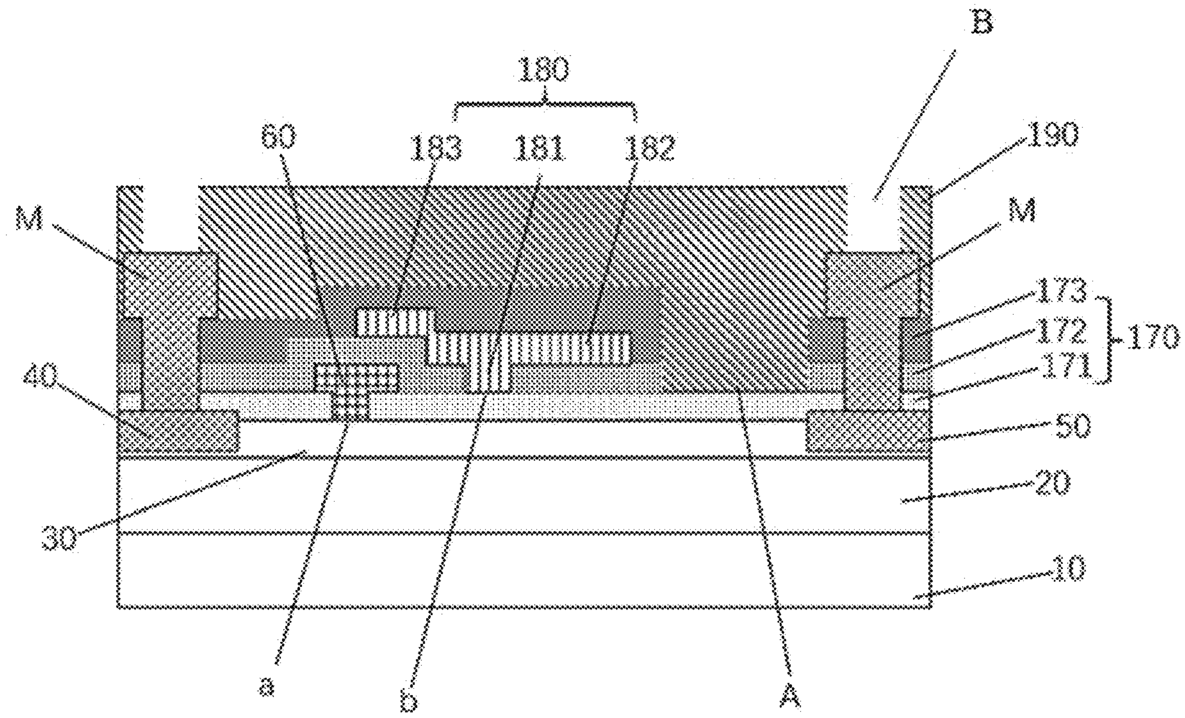
FIG. 3 illustrates a schematic cross-sectional view of a nitride semiconductor device according to an embodiment 2 of the disclosure.

As shown in FIG. 3, the difference between a nitride semiconductor device of the embodiment 2 and the embodiment 1 is that a low dielectric constant surface layer 190 is deposited on a surface of the device structure of the embodiment 1, and the low dielectric constant surface layer 190 fills the groove A. A material of the low dielectric constant surface layer 190 can be polybenzoxazole abbreviated as PBO (dielectric constant 2.8), polyimide and another low dielectric constant material with a dielectric constant less than 3, so as to avoid the influence of conventional plastic packaging materials with a higher dielectric constant (usually greater than 4) on the function of the groove A during subsequent plastic packaging. Interconnection metals M penetrate through the first to third dielectric layers and are connected to the source electrode 40 and the drain electrode 50 respectively. The low dielectric constant surface layer 190 is defined with cavities B to expose the interconnection metals M connected to the source electrode 40 and the drain electrode 50, respectively. Refer to the embodiment 1 for the rest.

Embodiment 3

Figure 4:
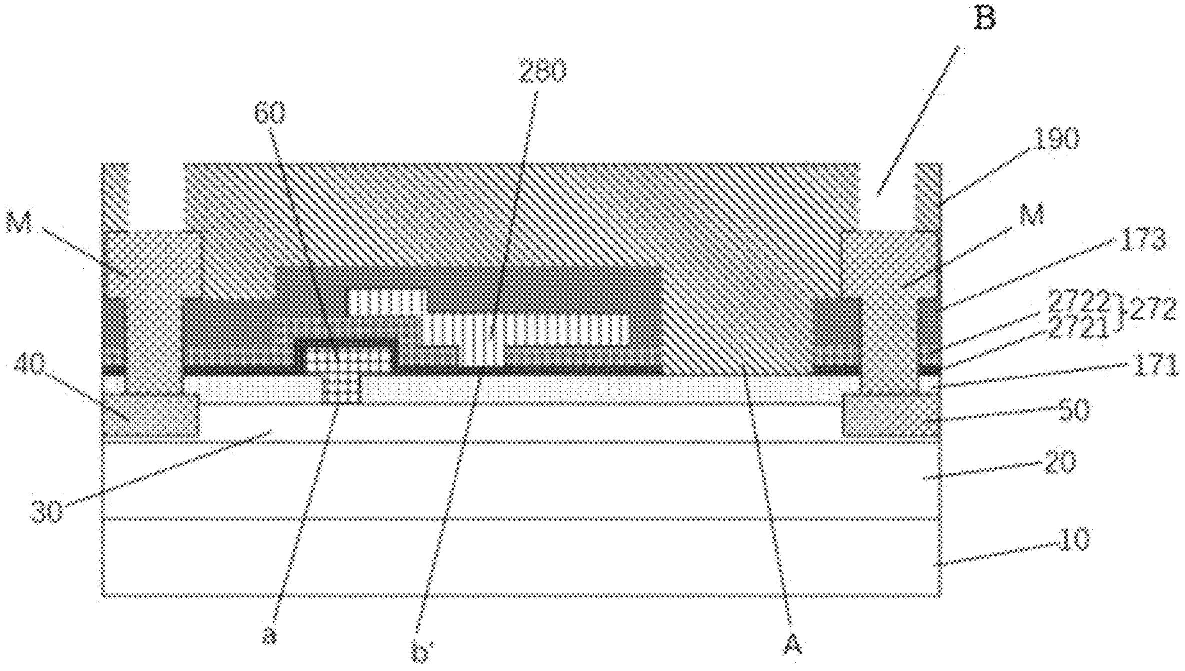
FIG. 4 illustrates a schematic cross-sectional view of the nitride semiconductor device according to an embodiment 3 of the disclosure.

As shown in FIG. 4, the difference between a nitride semiconductor device of the embodiment 3 and the nitride semiconductor device of the embodiment 2 is as follows.

The second dielectric layer 272 is a composite dielectric layer, including two or more layers, for example, including a lower layer 2721 and an upper layer 2722. When the second opening b' is etched until a surface of the lower layer 2721 is exposed, a difference between thicknesses of the two stepped portions of the stepped source field plate 280 is a thickness of the upper layer 2722. Refer to the embodiment 2 for the rest.

Figure 5:
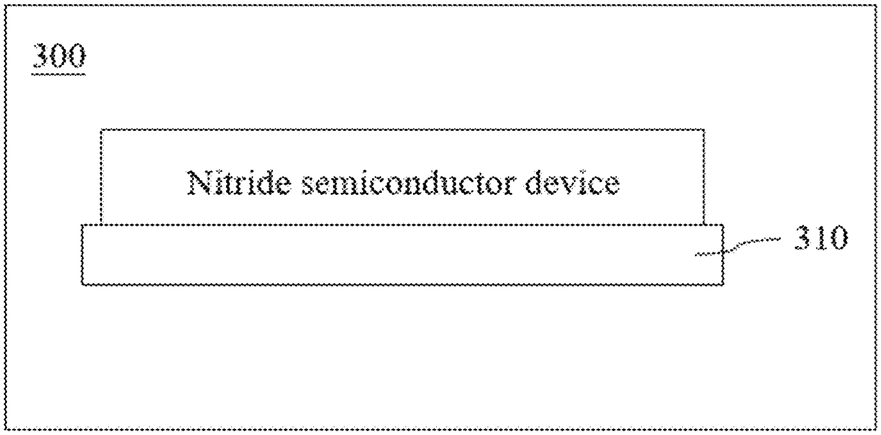
FIG. 5 illustrates a schematic diagram of an electronic device according to an embodiment of the disclosure.

Accordingly, as shown in FIG. 5, the nitride semiconductor device of the disclosure is applied to an electronic device 300, and the electronic device 300 includes a circuit board 310. The nitride semiconductor device described above is disposed on the circuit board 310.

The above embodiments are only used to further illustrate the nitride semiconductor device of the disclosure and its manufacturing method, but the disclosure is not limited to the embodiments, and all simple amendments, equivalent changes and modifications made to the above embodiments according to the technical essence of the disclosure fall within the protection scope of the technical solutions of the disclosure.

What is claimed is:

1. A nitride semiconductor device, comprising: a nitride epitaxial layer, a source electrode, a drain electrode, a gate electrode, a dielectric material layer, and a stepped source field plate; wherein the nitride epitaxial layer comprises a first heterojunction formed by a channel layer and a barrier layer, and the source electrode, the drain electrode and the gate electrode are located on the nitride epitaxial layer; the gate electrode is located between the source electrode and the drain electrode, and the dielectric material layer covers the nitride epitaxial layer and the gate electrode; the stepped source field plate is arranged in a part of the dielectric material layer located between the gate electrode and the drain electrode, the stepped source field plate comprises a first stepped portion and a second stepped portion respectively separated from the nitride epitaxial layer by different dielectric material layer thicknesses, and a projection of the second stepped portion on the nitride epitaxial layer covers a projection of the first stepped portion on the nitride epitaxial layer; and a part of the dielectric material layer located between the stepped source field plate and the drain electrode is defined with a groove.

2. The nitride semiconductor device as claimed in claim 1, wherein the first stepped portion is close to the gate electrode, and the second stepped portion extends from the first stepped portion toward the drain electrode.

3. The nitride semiconductor device as claimed in claim 2, wherein the first stepped portion is separated from the nitride epitaxial layer by a dielectric material layer thickness h1 of the different dielectric material layer thicknesses, and the second stepped portion is separated from the nitride epitaxial layer by a dielectric material layer thickness h2 of the different dielectric material layer thicknesses, and the dielectric material layer thickness h1 is smaller than the dielectric material layer thickness h2.

4. The nitride semiconductor device as claimed in claim 3, wherein the stepped source field plate further comprises a third stepped portion extending from the first stepped portion toward the gate electrode, and the third stepped portion extends above the gate electrode and is separated from the gate electrode by a part of the dielectric material layer.

5. The nitride semiconductor device as claimed in claim 4, wherein a distance from a side surface of the third stepped portion close to the nitride epitaxial layer to a surface of the nitride epitaxial layer in contact with the dielectric material layer is greater than a distance from a side surface of the second stepped portion close to the nitride epitaxial layer to the surface of the nitride epitaxial layer in contact with the dielectric material layer, and the distance from the side surface of the second stepped portion close to the nitride epitaxial layer to the surface of the nitride epitaxial layer in contact with the dielectric material layer is greater than a distance from a side surface of the first stepped portion close to the nitride epitaxial layer to the surface of the nitride epitaxial layer in contact with the dielectric material layer.

6. The nitride semiconductor device as claimed in claim 4, wherein a projection of the third stepped portion on the nitride epitaxial layer does not coincide with the projection of the first stepped portion on the nitride epitaxial layer, and the projection of the third stepped portion on the nitride epitaxial layer partially coincides with the projection of the second stepped portion on the nitride epitaxial layer.

7. The nitride semiconductor device as claimed in claim 1, wherein a material of the dielectric material layer comprises one or more selected from the group consisting of silicon nitride ($SiN_x$), silicon oxide ($SiO_x$), aluminum oxide ($AlO_x$), silicon oxynitride ($Si_xON_y$), aluminum nitride (AlN), hafnium oxide ($HfO_x$), and aluminum oxynitride ($Al_xON_y$).

8. The nitride semiconductor device as claimed in claim 1, wherein the dielectric material layer comprises a first dielectric layer and a second dielectric layer, and the gate electrode is exposed by the first dielectric layer and covered by the second dielectric layer.

9. The nitride semiconductor device as claimed in claim 8, wherein a thickness of the first dielectric layer is in a range of 20 nanometers (nm) to 200 nm, a thickness of the second dielectric layer is in a range of 50 nm to 500 nm; and a material of each of the first dielectric layer and the second dielectric layer comprises: $SiN_x$, $SiO_x$, $Si_xON_y$, $AlO_x$, AlN, $Al_xON_y$, or $HfO_x$.

10. The nitride semiconductor device as claimed in claim 8, wherein the first dielectric layer is arranged on a surface of the nitride epitaxial layer and is defined with a first opening to accommodate the gate electrode.

11. The nitride semiconductor device as claimed in claim 10, wherein the second dielectric layer covers the gate electrode and the first dielectric layer, the second dielectric layer is defined with a second opening, the first stepped portion is disposed in the second opening, and the second stepped portion is disposed on a surface of the second dielectric layer.

12. The nitride semiconductor device as claimed in claim 8, wherein the dielectric material layer further comprises a third dielectric layer covering the second dielectric layer and the stepped source field plate.

13. The nitride semiconductor device as claimed in claim 12, wherein a part of the first dielectric layer is reserved between a bottom of the groove and the nitride epitaxial layer, and a thickness of the third dielectric layer is in a range of 50 nm to 1 micrometer (μm).

14. The nitride semiconductor device as claimed in claim 1, further comprising: a target dielectric constant surface layer, wherein the target dielectric constant surface layer fills the groove, and a dielectric constant of the target dielectric constant surface layer is less than 3.

15. The nitride semiconductor device as claimed in claim 2, wherein a spacing between the first stepped portion and the gate electrode is greater than 0.1 μm.

16. The nitride semiconductor device as claimed in claim 2, wherein a spacing between a side wall of the groove close to the stepped source field plate and the stepped source field plate and a spacing between another side wall of the groove close to the drain electrode and the drain electrode are greater than 0.1 μm.

17. The nitride semiconductor device as claimed in claim 10, wherein the gate electrode is formed in the first opening and extends to a surface of the first dielectric layer on two sides of the first opening to form a T-shaped gate structure.

18. The nitride semiconductor device as claimed in claim 8, wherein the second dielectric layer is a composite dielectric layer, comprising a lower layer and an upper layer; the second dielectric layer is defined with a second opening, and the first stepped portion is arranged in the second opening, and the first stepped portion is in direct contact with the lower layer.

19. The nitride semiconductor device as claimed in claim 18, further comprising a target dielectric constant surface layer and interconnection metals; wherein the target dielectric constant surface layer fills the groove, the interconnection metals penetrate through the dielectric material layer and are respectively connected to the source electrode and the drain electrode; and the target dielectric constant surface layer is defined with cavities to expose the interconnection metals connecting the source electrode and the drain electrode respectively.

20. An electronic device, comprising:

a circuit board; wherein the nitride semiconductor device as claimed in claim 1 is disposed on the circuit board.

* * * * *